United States Patent
Shen

(10) Patent No.: US 9,601,407 B2
(45) Date of Patent: Mar. 21, 2017

(54) SYSTEM-IN-PACKAGE MODULE AND METHOD FOR FORMING THE SAME

(71) Applicant: Quanta Computer Inc., Kuei Shan Hsiang, Tao Yuan Shien (TW)

(72) Inventor: Li-Cheng Shen, Tao Yuan Shien (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 95 days.

(21) Appl. No.: 14/314,150

(22) Filed: Jun. 25, 2014

(65) Prior Publication Data
US 2015/0270200 A1   Sep. 24, 2015

(30) Foreign Application Priority Data
Mar. 19, 2014   (TW) .............................. 103108594 A

(51) Int. Cl.
*H01L 23/498*   (2006.01)
*H01L 23/433*   (2006.01)
(Continued)

(52) U.S. Cl.
CPC .......... *H01L 23/433* (2013.01); *H01L 23/367* (2013.01); *H01L 24/19* (2013.01); *H01L 24/20* (2013.01); *H01L 24/97* (2013.01); *H01L 24/29* (2013.01); *H01L 24/32* (2013.01); *H01L 24/75* (2013.01); *H01L 24/83* (2013.01); *H01L 25/0655* (2013.01); *H01L 25/18* (2013.01);
(Continued)

(58) Field of Classification Search
CPC ..... H01L 23/433; H01L 23/367; H01L 24/19; H01L 24/20; H01L 24/97; H01L 24/29; H01L 24/32; H01L 24/75; H01L 24/83; H01L 25/00; H01L 25/0655; H01L 25/18; H01L 25/50; H01L 25/043; H01L 25/0652; H01L 25/0657; H01L 25/071; H01L 25/074; H01L 25/0756; H01L 25/117; H01L 27/00; H01L 2224/2919; H01L 2224/32245; H01L 2224/40137; H01L 2224/73267; H01L 2224/75745; H01L 2224/83191; H01L 2224/97; H01L 2924/1421; H01L 2924/15321; H01L 2924/19041; H01L 2924/19042; H01L 2924/19043; H01L 2924/19105; H01L 2924/37001; H01L 2224/19
USPC ......................................................... 257/686
See application file for complete search history.

(56) References Cited

U.S. PATENT DOCUMENTS 5,646,828 A * 7/1997 Degani ................... H01L 23/13
257/707
5,982,038 A * 11/1999 Toy .......................... H01L 23/10
257/772
(Continued)

*Primary Examiner* — Tod T Van Roy
*Assistant Examiner* — Delma R Forde
(74) *Attorney, Agent, or Firm* — McClure, Qualey & Rodack, LLP

(57) ABSTRACT

A system-in-package (SiP) module is disclosed. The SiP module includes a substrate and a dam on the substrate. The dam defines a cavity. At least one chip is on the substrate inside the cavity. A printed circuit board (PCB) is bonded to the dam and covers the cavity. A thermal conductive sheet is in the cavity and is disposed between the chip and the PCB. The chip is in thermal contact with the PCB through the thermal conductive sheet. The disclosure also provides a method for manufacturing the SiP module.

6 Claims, 5 Drawing Sheets

(51) Int. Cl.
*H01L 23/367* (2006.01)
*H01L 23/00* (2006.01)
*H01L 25/065* (2006.01)
*H01L 25/00* (2006.01)
*H01L 25/18* (2006.01)

(52) U.S. Cl.
CPC ...... *H01L 25/50* (2013.01); *H01L 2224/2919* (2013.01); *H01L 2224/32245* (2013.01); *H01L 2224/40137* (2013.01); *H01L 2224/73267* (2013.01); *H01L 2224/75745* (2013.01); *H01L 2224/83191* (2013.01); *H01L 2224/97* (2013.01); *H01L 2924/1421* (2013.01); *H01L 2924/15321* (2013.01); *H01L 2924/19041* (2013.01); *H01L 2924/19042* (2013.01); *H01L 2924/19043* (2013.01); *H01L 2924/19105* (2013.01); *H01L 2924/37001* (2013.01)

(56) References Cited

U.S. PATENT DOCUMENTS

| | | | | |
|---|---|---|---|---|
| 6,493,229 | B2* | 12/2002 | Akram | H01L 23/3121 257/686 |
| 2002/0008963 | A1* | 1/2002 | DiBene, II | G06F 1/18 361/720 |
| 2006/0022303 | A1* | 2/2006 | Desai | G11C 11/22 257/532 |
| 2007/0026567 | A1* | 2/2007 | Beer | G01S 7/032 438/106 |
| 2009/0045505 | A1* | 2/2009 | Hsu | H01L 23/3192 257/706 |
| 2009/0283902 | A1* | 11/2009 | Bezama | H01L 23/3675 257/713 |
| 2015/0052722 | A1* | 2/2015 | Ke | H01L 21/6835 29/281.5 |

* cited by examiner

SYSTEM-IN-PACKAGE MODULE AND METHOD FOR FORMING THE SAME

CROSS REFERENCE TO RELATED APPLICATIONS

This application claims the priority of Taiwan Patent Application No. 103108594 filed on Mar. 19, 2014, and the entirety of which is incorporated by reference herein.

BACKGROUND OF THE INVENTION

Field of the Invention

The present invention relates to a package technique, and more particularly to a system-in-package (SiP) module and a method for forming the same.

Description of the Related Art

System-in-package (SiP) technique, which may exhibit various configurations such as multi-chip module (MCM), multi-chip package (MCP), chip stack or active/passive elements embedded in the substrate, means that a plurality of integrated circuit (IC) chips and/or passive elements are integrated into a package. Since the SiP technique allows the possibility of hetero-integration, it is extensively applied to various miniature devices. Further, since each of the chips in the SiP module can be developed individually, the SiP technique enables a shorter development period and lower development costs as compared to the system-on-chip (SOC) technique. Accordingly, the SiP technique is often utilized in products integrating various IC chips and/or passive elements, such as digital camera, MP3 or cell phone.

In the course of IC evolution, however, the integration density of electronic components (e.g., transistors, diodes, etc.) in chips has gradually increased and chip sizes have gradually reduced, thus the heat accumulation in SiP modules has increased as well. Refer to FIGS. 1 and 2. FIG. 1 illustrates the variation of the temperature of a conventional SiP module having a wireless transmission chip with time. FIG. 2 illustrates the variation of the signal throughput of the wireless transmission chip in the SiP module of FIG. 1 with time. As shown in FIGS. 1 and 2, the signal throughput of the wireless transmission chip dramatically drops while the temperature of the SiP module reaches a critical value. Namely, if too much heat accumulates in the SiP module, the packaged chips may lose their original function, and the reliability of the product is thus degraded.

Therefore, there is a need for a novel SiP module and a method for forming the same, thereby improving the heat-dissipation efficiency thereof.

BRIEF SUMMARY OF THE INVENTION

A detailed description is given in the following embodiments with reference to the accompanying drawings.

An exemplary embodiment of a system-in-package (SiP) module includes a substrate. A dam is disposed on the substrate and defines a cavity. At least one chip is disposed on the substrate inside the cavity. A printed circuit board (PCB) is bonded to the dam and covers the cavity. A thermal conductive sheet is disposed in the cavity and between the chip and the PCB, wherein the chip is in thermal contact with the PCB through the thermal conductive sheet.

An exemplary embodiment of a method for forming a system-in-package (SiP) module includes providing a substrate having a plurality of packaging regions. A dam and at least one chip are disposed on each of the packaging regions, wherein the chip is in a cavity defined by the dam. A thermal conductive sheet is disposed in each of the cavities corresponding to the packaging regions, such that the thermal conductive sheet is in thermal contact with the chip. The substrate is diced along a periphery of the packaging regions to form a plurality of packages. Each of the packages is bonded to a printed circuit board (PCB), wherein the chip is in thermal contact with the PCB through the thermal conductive sheet.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of implementing the invention. This description is made for the purpose of illustrating the general principles of the invention and should not be taken in a limiting sense. The scope of the invention is best determined by reference to the appended claims.

Figure 1:
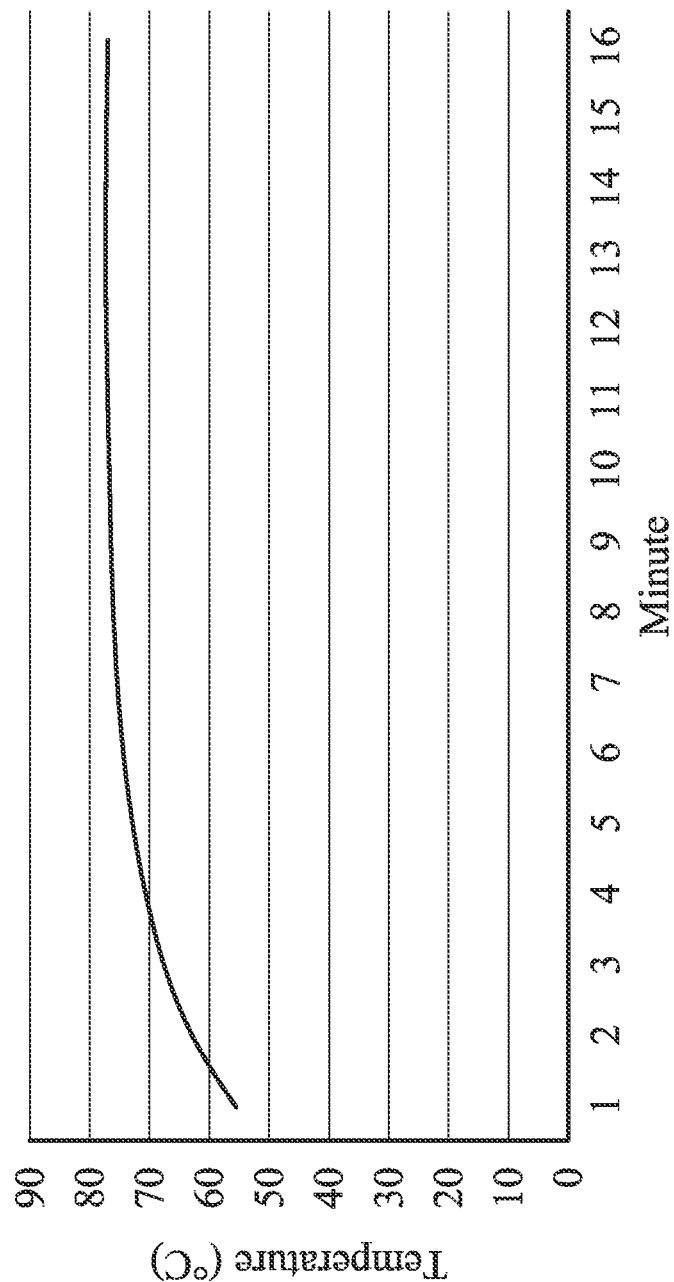
FIG. 1 is a graph illustrating the variation of the temperature of a conventional SiP module having a wireless transmission chip with time.
Figure 2:
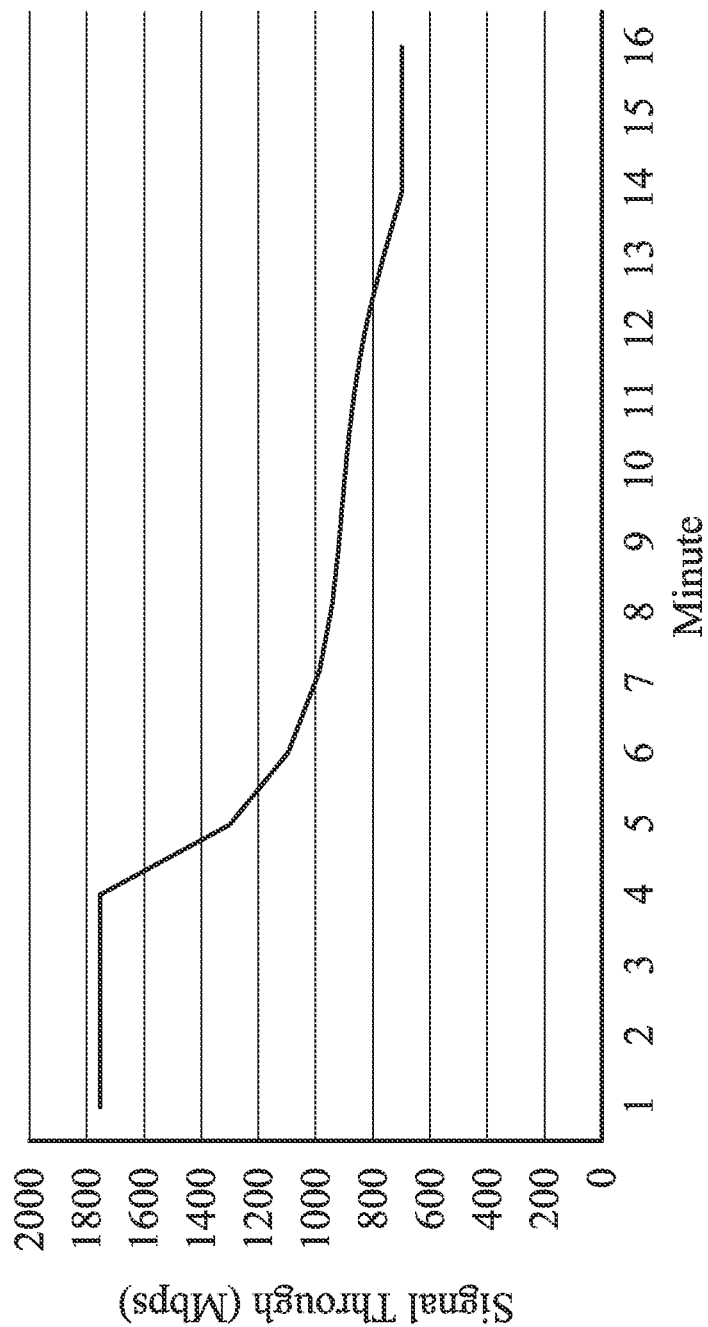
FIG. 2 is a graph illustrating the variation of the signal throughput of the wireless transmission chip in the SiP module of FIG. 1 with time.
Figure 3A:
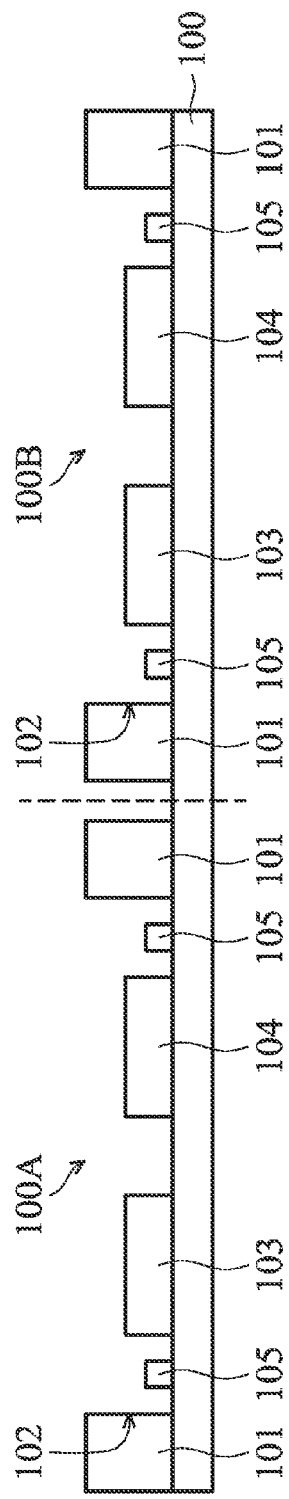
FIGS. 3A-3F are cross-sectional views of a method for forming a SiP module according to an embodiment of the disclosure.
Figure 3B:
Figure 3C:
Figure 3D:
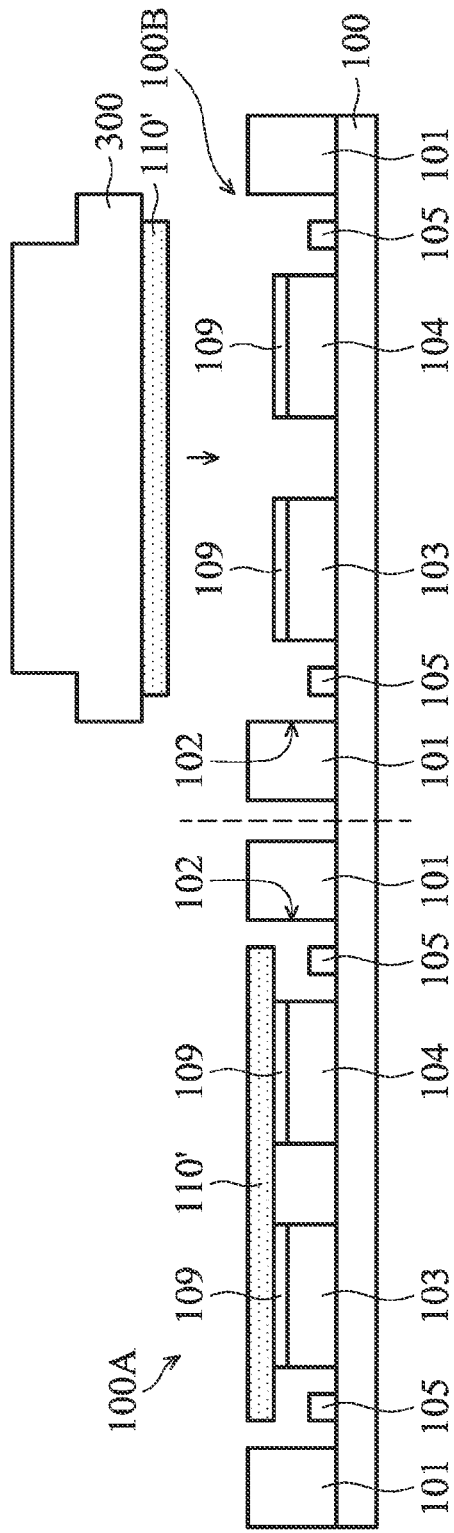
Figure 3E:
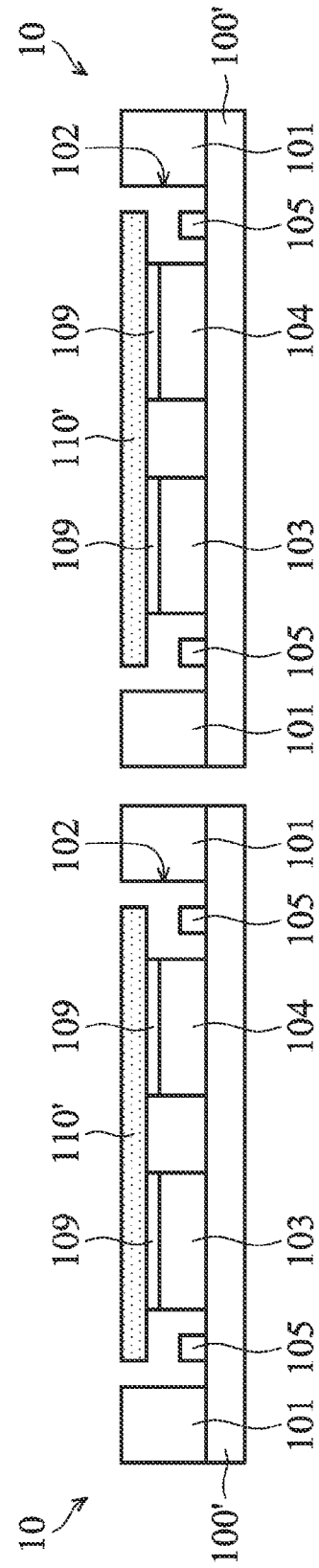
Figure 3F:
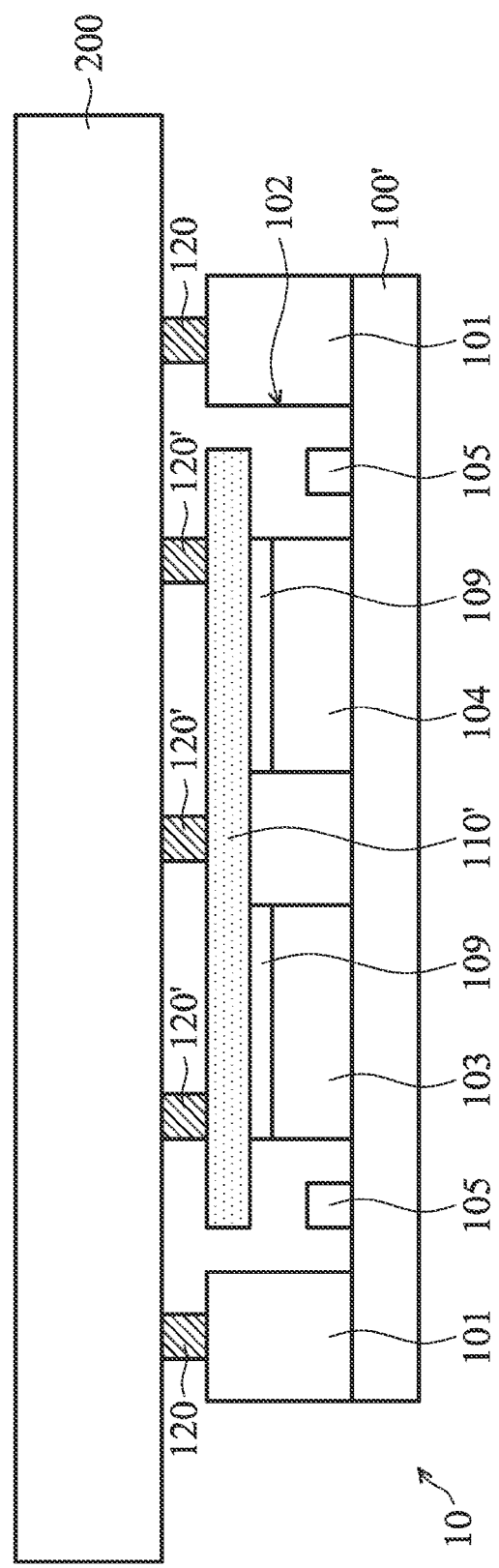

FIG. 3F is a cross-sectional view of a SiP module according to an embodiment of the disclosure. Refer to FIG. 3. In the embodiment, the SiP module includes a substrate 100'. A dam 101 and chips 103 and 104 are disposed on the substrate 100'. The dam 101 defines a cavity 102 and the chips 103 and 104 are disposed in the cavity 102.

In the embodiment, the substrate 100' and the dam 101 may have an interconnect structure (not shown) therein, which may include components such as metal lines, metal vias and pads. The chips 103 and 104 may form an electrical contact by the interconnect structure.

Passive elements 105 may be optionally disposed on the substrate 100' inside the cavity 102. In the embodiment, an electrical connection for the passive elements 105 is formed by the interconnect structure in the substrate 100' and dam 101.

As illustrated in FIG. 3F, the SiP module includes a printed circuit board (PCB) 200 bonded to the dam 101 and covering the cavity 102, and a thermal conductive sheet 110' disposed in the cavity 102 and between the chips 103 and 104 and the PCB 200. The chips 103 and 104 are in thermal contact with the PCB 200 through the thermal conductive sheet 110'.

In the embodiment, the PCB 200 is bonded to the dam 101 by solder bumps 120, and is electrically connected to the chips 103 and 104 by the interconnect structure in the substrate 100' and the dam 101.

In the embodiment, at least one thermal conductive component may be formed between the thermal conductive sheet 110' and the PCB 200. For example, additional solder bumps 120' may be disposed between the thermal conductive sheet 110' and the PCB 200 to act as the thermal conductive components, but it is not limited thereto. In other embodiments, various types of thermal conductive components may be utilized, such as thermal grease, silver paste or thermal conductive paste.

In another embodiment, the thermal conductive sheet 110' may be in direct contact with the PCB 200. Namely, there may be no thermal conductive components between the thermal conductive sheet 110' and the PCB 200.

In the above embodiments, the thermal conductive sheet 110' is disposed between the chips 103 and 104 and the PCB 200, such that the thermal conductive sheet 110' is in thermal contact with the chips 103 and 104 and the PCB 200, respectively. Therefore, the heat dissipation path between the chips 103 and 104 and the PCB 200 can be shortened, such that the heat generated by the chips 103 and 104 can be efficiently dissipated toward the PCB 200 through the thermal conductive sheet 110'. As a result, the hot-spot issue induced by poor heat dissipation in a conventional SiP module can be improved, and the lifespan and reliability of the SiP module can thus be improved as well.

FIGS. 3A-3F are cross-sectional views of a method for forming a SiP module according to an embodiment of the disclosure. Refer to FIG. 3A, a substrate 100 having packaging regions 100A and 100B is provided. Then, a dam 101 and chips 103 and 104 are disposed on each of the packaging regions 100A. The chips 103 and 104 are disposed in a cavity 102 defined by the dam 101.

For the sake of simplicity, FIG. 3A and the following drawings only illustrate two packaging regions 100A and 100B. It should be appreciated, however, that the substrate 100 may provide more packaging regions according to the disclosure. Furthermore, while FIG. 3A and the following drawings illustrate two chips 103 and 104 disposed in each of the cavities 102 corresponding to the packaging regions 100A and 100B, it is not limited thereto. It should be appreciated that one or more chips may be disposed in each of the cavities 102.

In the embodiment, the substrate 100 may be a packaging substrate, which may include paper phenolic resin, composite epoxy resin, polyimide resin, glass fiber or any material for a packaging substrate known in the art. In an embodiment, the dam 101 and the substrate 100 may be formed of the same material.

In the embodiment, the chips 103 and 104 may be different types of chips, which include, but are not limited to, logic chips, memories, processors, baseband chips or radio frequency chips. For example, the chip 103 may be a baseband chip and the chip 104 may be a radio frequency chip, but it is not limited thereto. It is appreciated that the SiP module of the disclosure may be applied to the packages of various types of chips.

In the embodiment, the substrate 100 and the dam 101 have an interconnect structure (not shown) therein, which may include components such as metal lines, metal vias and pads, and may be fabricated by a process such as a fully additive process, a semi-additive process, a subtractive process or any other suitable method. An internal or external electrical connection for the chips 103 and 104 is formed by the interconnect structure.

In the embodiment, passive elements 105, such as filters, capacitors, resistors, inductors, etc., may be optionally formed on the substrate 100 inside each of the cavities 102 corresponding to the packaging regions 100A and 100B. In the embodiment, an electrical connection for the passive elements 105 may be formed by the interconnect structure in the substrate 100 and the dam 101.

Refer to FIG. 3B, a thermal conductive plate 110 is provided. The thermal conductive plate may include metal, alloy, graphite or composite material. Then, as illustrated in FIG. 3C, the thermal conductive plate 110 is diced to a plurality of thermal conductive sheets 110' corresponding to the packaging regions 100A and 100B.

The size of the thermal conductive sheet 110' is smaller than that of the cavity 102 to allow the thermal conductive sheet 110' to be disposed in the cavity 102 in the following process (e.g., the process indicated shown in FIG. 3D). In an embodiment, the size of the thermal conductive sheet 110' may be larger than the total sizes of the chips 103 and 104, such that the thermal conductive sheet 110' completely covers the chips 103 and 104 in the cavity 102 after being disposed in the cavity 102, as shown in FIG. 3D.

Refer to FIG. 3D, the thermal conductive sheet 110' is disposed in each of the cavities 102 corresponding to the packaging regions 100A and 100B, such that the thermal conductive sheet 110' is in thermal contact with the corresponding chips 103 and 104. In the embodiment of FIG. 3D, the disposing step may include forming an adhesion layer 109 respectively on the chips 103 and 104 corresponding to each of the packaging regions 100A and 100B. The thermal conductive sheet 110' is then bonded to the chips 103 and 104 by the adhesion layer 109 using a bonding head 300 to suck each of the thermal conductive sheets 110' and to transfer the thermal conductive sheet 110' to each of the cavities 102 corresponding to the packaging regions 100A and 100B in sequence. In the above embodiment, the thermal conductive sheets 110' are sequentially transferred by the bonding head 300, such that the thermal conductive sheet 110' is accurately disposed in the cavity 102.

In another embodiment, after dicing the thermal conductive plate 110 and forming the adhesion layer 109, the thermal conductive sheets 110' are bonded to the chips 103 and 104 through the adhesion layer 109 using a bonding head (e.g., bonding head 300) to suck the back side of the substrate 100 (i.e., the side without forming the cavity 102) (not shown), thereby transferring the substrate 100 to the thermal conductive sheets 110' and aligning each of cavities 102 on the substrate 100 to one of the thermal conductive sheets 110'. In the above embodiment, each of the thermal conductive sheets 110' is disposed in each of the cavities 102 corresponding to the packaging regions 100A and 100B in a batch, such that the manufacturing cycle is shortened and the yield is improved.

In an embodiment, a surface of the thermal conductive sheet 110' may be level with that of the dam 101, such that the thermal conductive sheet 110' can be in good contact with the thermal conductive components (e.g., solder bumps 120' shown in FIG. 3F) formed subsequently.

Refer to FIG. 3E, the substrate 100 is diced into a plurality of substrates 100' along a periphery of the packaging regions 100A and 100B (e.g., the dash line indicated by FIG. 3D), thereby forming a plurality of packages 10. The substrate 100 can be diced into the plurality of substrates 100' by any suitable method. For example, the substrate 100 is diced using a dicing blade, a chemical etchant or laser. These methods are known for those skilled in the art, and thus are not described in detail herein.

Refer to FIG. 3F. Each of the separated packages 10 is bonded to a printed circuit board (PCB) 200. The chips 103 and 104 are in thermal contact with the PCB 200 through the thermal conductive sheet 110'.

In the embodiment, solder bumps 120 may be formed between the dam 101 and the PCB 200, thereby bonding the PCB 200 to the dam 101. The PCB 200 may be electrically connected to the chips 103 and 104 through the interconnect structure in the substrate 100' and the dam 101.

In an embodiment, at least one thermal conductive component may be formed between the thermal conductive sheet 110' and the PCB 200. For example, additional solder bumps 120' may be disposed between the thermal conductive sheet 110' and the PCB 200 to act as the thermal conductive components. In this embodiment, the solder bumps 120' and the solder bump 120 may be formed by the same process (such as screen printing) and may have substantially same height. In other embodiment, other types of thermal conductive components may be formed between the thermal conductive sheet 110' and the PCB 200, such as thermal grease, silver paste or thermal conductive paste.

In another embodiment, the thermal conductive sheet 110' may directly contact the PCB 200. Namely, there may be no thermal conductive components between the thermal conductive sheet 110' and the PCB 200.

According to the above embodiments, the thermal conductive sheet 110' is disposed between the chips 103 and 104 and the PCB 200, such that the thermal conductive sheet 110' is in thermal contact with the chips 103 and 104 and the PCB 200, respectively. Therefore, the heat dissipation path between the chips 103 and 104 and the PCB 200 can be shortened, such that the heat generated by the chips 103 and 104 can be efficiently dissipated toward the PCB 200 through the thermal conductive sheet 110'. As a result, the hot-spot issue induced by poor heat dissipation in a conventional SiP module can be improved, and the lifespan and reliability of the SiP module can thus be improved as well.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system-in-package (SiP) module, comprising:
    a substrate;
    a dam disposed on the substrate and defining a cavity;
    at least one chip disposed on the substrate inside the cavity;
    a printed circuit board (PCB) bonded to the dam and covering the cavity; and
    a thermal conductive sheet disposed in the cavity and between the chip and the PCB, wherein the chip is in thermal contact with the PCB through the thermal conductive sheet; and
    at least one thermal conductive component disposed on the thermal conductive sheet, wherein the thermal conductive sheet is disposed between the thermal conductive component and the chip.

2. The SiP module as claimed in claim 1, wherein a surface of the thermal conductive sheet is level with that of the dam.

3. The SiP module as claimed in claim 1, wherein the thermal conductive component is disposed between the thermal conductive sheet and the PCB, and the thermal conductive component comprises a solder bump or thermal grease.

4. The SiP module as claimed in claim 1, wherein the substrate and the dam comprise an interconnect structure, such that the chip is electrically connected to the PCB by the interconnect structure.

5. The SiP module as claimed in claim 1, further comprising an adhesion layer disposed between the chip and the thermal conductive sheet.

6. The SiP module as claimed in claim 1, further comprising a plurality of passive elements disposed on the substrate inside the cavity.

* * * * *